United States Patent
Chang et al.

(10) Patent No.: US 10,410,690 B1
(45) Date of Patent: Sep. 10, 2019

(54) REFERENCE-FREE MULTI-LEVEL SENSING CIRCUIT FOR COMPUTING-IN-MEMORY APPLICATIONS, REFERENCE-FREE MEMORY UNIT FOR COMPUTING-IN-MEMORY APPLICATIONS AND SENSING METHOD THEREOF

(71) Applicant: NATIONAL TSING HUA UNIVERSITY, Hsinchu (TW)

(72) Inventors: Meng-Fan Chang, Taichung (TW); Jia-Jing Chen, Taoyuan (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/109,734

(22) Filed: Aug. 22, 2018

(51) Int. Cl.
 G11C 7/00 (2006.01)
 G11C 7/06 (2006.01)
 G11C 7/12 (2006.01)

(52) U.S. Cl.
 CPC ............. G11C 7/065 (2013.01); G11C 7/12 (2013.01)

(58) Field of Classification Search
 CPC .................. G11C 7/065; G11C 7/12
 USPC .......................... 365/203, 205, 207
 See application file for complete search history.

(56) References Cited

U.S. PATENT DOCUMENTS

2005/0146960 A1* 7/2005 Sekiguchi .............. G11C 5/025
 365/205

* cited by examiner

*Primary Examiner* — Huan Hoang
(74) *Attorney, Agent, or Firm* — CKC & Partners Co., LLC

(57) ABSTRACT

A reference-free multi-level sensing circuit for computing-in-memory applications is controlled by a first bit line and a second bit line. An encoding unit generates a first register output value and a plurality of encoded values. The first register output value feedback controls a precharging unit so as to enable the precharging unit to precharge one of the first bit line and the second bit line according to the first register output value. A voltage level of the one of the first bit line and the second bit line is lower than a voltage level of the other one of the first bit line and the second bit line. The encoded values and the first register output value are formed a multi-bit signal to estimate voltage levels of the first bit line and the second bit line.

15 Claims, 9 Drawing Sheets

US 10,410,690 B1

REFERENCE-FREE MULTI-LEVEL SENSING CIRCUIT FOR COMPUTING-IN-MEMORY APPLICATIONS, REFERENCE-FREE MEMORY UNIT FOR COMPUTING-IN-MEMORY APPLICATIONS AND SENSING METHOD THEREOF

BACKGROUND

Technical Field

The present disclosure relates to a multi-level sensing circuit for computing-in-memory applications, a memory unit for computing-in-memory applications and a sensing method thereof. More particularly, the present disclosure relates to a reference-free multi-level sensing circuit for computing-in-memory applications, a reference-free memory unit for computing-in-memory applications and a sensing method thereof.

Description of Related Art

In these years, due to the industrial growth of mobile device, medical electrical equipment, portable storage, etc., requirement of memory with low power, high speed and high density is increased. For computing in memory, a large number of word lines (WL) are activated at same time. Various input patterns cause a widely bit-line (BL) current distribution. The BL current distribution of computational results (multiply-and-accumulate (MAC) value) is dependent on the various input patterns.

FIG. 1 shows a block diagram of a conventional memory unit for computing-in-memory applications; and FIG. 2 shows a schematic view of a probability distribution of a voltage $V_{BL}$ of a first bit line BL of FIG. 1. The conventional memory unit includes a word-line driver 110, a memory array 120, a reference generator 130 and an input/output (I/O) unit 140. When sensing the memory array 120, the reference generator 130 needs to generate a plurality of reference voltages corresponding to the various input patterns, and then the voltage $V_{BL}$ of the first bit line BL are digitalized. However, there is a small sensing margin D1 between one of voltage levels of the first bit lines BL (e.g., "Mac 1"-"Mac 8" in FIG. 2) and one of the reference voltages (e.g., "Ref 1"-"Ref 7" in FIG. 2). The reference generator 130 generates the reference voltages and causes very large power consumption. Therefore, a reference-free multi-level sensing circuit for computing-in-memory applications, a reference-free memory unit for computing-in-memory applications and a sensing method thereof having the features of increasing the sensing margin and removing the power consumption of the reference generator are commercially desirable.

SUMMARY

According to one aspect of the present disclosure, a reference-free multi-level sensing circuit for computing-in-memory applications is controlled by a first bit line and a second bit line. The reference-free multi-level sensing circuit for the computing-in-memory applications includes a voltage sense amplifier, a precharging unit and an encoding unit. The voltage sense amplifier is electrically connected to the first bit line and the second bit line. The precharging unit is electrically connected to the voltage sense amplifier. The encoding unit is electrically connected to the voltage sense amplifier. The encoding unit includes a first register, a second register, a third register, a fourth register and an encoder. The first register is electrically connected to the voltage sense amplifier and outputs a first register output value. The first register output value feedback controls the precharging unit so as to enable the precharging unit to precharge one of the first bit line and the second bit line according to the first register output value. A voltage level of the one of the first bit line and the second bit line is lower than a voltage level of the other one of the first bit line and the second bit line. The second register is electrically connected to the voltage sense amplifier and outputs a second register output value. The third register is electrically connected to the second register and outputs a third register output value. The fourth register is electrically connected to the third register and outputs a fourth register output value. The encoder is electrically connected to the second register, the third register and the fourth register. The encoder generates a plurality of encoded values according to the second register output value, the third register output value and the fourth register output value, and the encoded values and the first register output value are formed a multi-bit signal to estimate voltage levels of the first bit line and the second bit line.

According to another aspect of the present disclosure, a reference-free memory unit for computing-in-memory applications includes at least one memory cell and a reference-free multi-level sensing circuit for computing-in-memory applications. The at least one memory cell is connected between a first bit line and a second bit line. The at least one memory cell is connected to a word line and controlled by the word line. The reference-free multi-level sensing circuit for the computing-in-memory applications is connected to the at least one memory cell and controlled by the first bit line, the second bit line and the word line. The reference-free multi-level sensing circuit for the computing-in-memory applications includes a voltage sense amplifier, a precharging unit and an encoding unit. The voltage sense amplifier is electrically connected to the first bit line and the second bit line. The precharging unit is electrically connected between the first bit line and the second bit line. The encoding unit is electrically connected to the voltage sense amplifier and includes a first register, a second register, a third register, a fourth register and an encoder. The first register is electrically connected to the voltage sense amplifier and outputs a first register output value. The first register output value feedback controls the precharging unit so as to enable the precharging unit to precharge one of the first bit line and the second bit line according to the first register output value, and a voltage level of the one of the first bit line and the second bit line is lower than a voltage level of the other one of the first bit line and the second bit line. The second register is electrically connected to the voltage sense amplifier and outputs a second register output value. The third register is electrically connected to the second register and outputs a third register output value. The fourth register is electrically connected to the third register and outputs a fourth register output value. The encoder is electrically connected to the second register, the third register and the fourth register. The encoder generates a plurality of encoded values according to the second register output value, the third register output value and the fourth register output value, and the encoded values and the first register output value are formed a multi-bit signal to estimate voltage levels of the first bit line and the second bit line.

According to further another aspect of the present disclosure, a sensing method of the reference-free memory unit for the computing-in-memory applications provides a voltage level applying step, a first sensing step, a second sensing step, a third sensing step and a fourth sensing step. The voltage level applying step is for applying a voltage level to the word line. The first sensing step is for driving the memory cell to generate the first bit line and the second bit line according to the voltage level of the word line. The second sensing step is for driving the voltage sense amplifier to generate an output voltage level of a first output node according to the first bit line and the second bit line. The third sensing step is for driving the encoding unit to generate a switching signal according to the output voltage level of the first output node, and transmitting the switching signal to the precharging unit so as to enable the precharging unit to precharge one of the first bit line and the second bit line according to the first register output value. The voltage level of the one of the first bit line and the second bit line is lower than a voltage level of the other one of the first bit line and the second bit line. The fourth sensing step is for driving the voltage sense amplifier and the encoding unit to generate the multi-bit signal according to the first bit line and the second bit line.

BRIEF DESCRIPTION OF THE DRAWINGS

The present disclosure can be more fully understood by reading the following detailed description of the embodiment, with reference made to the accompanying drawings as follows.

DETAILED DESCRIPTION

Before describing any embodiments in detail, some terms used in the following are described. A voltage level of "1" represents that the voltage is equal to a voltage source VDD. The voltage level of "0" represents that the voltage is equal to a ground voltage. A PMOS transistor and an NMOS transistor represent a P-type MOS transistor and an N-type MOS transistor, respectively.

Figure 3:
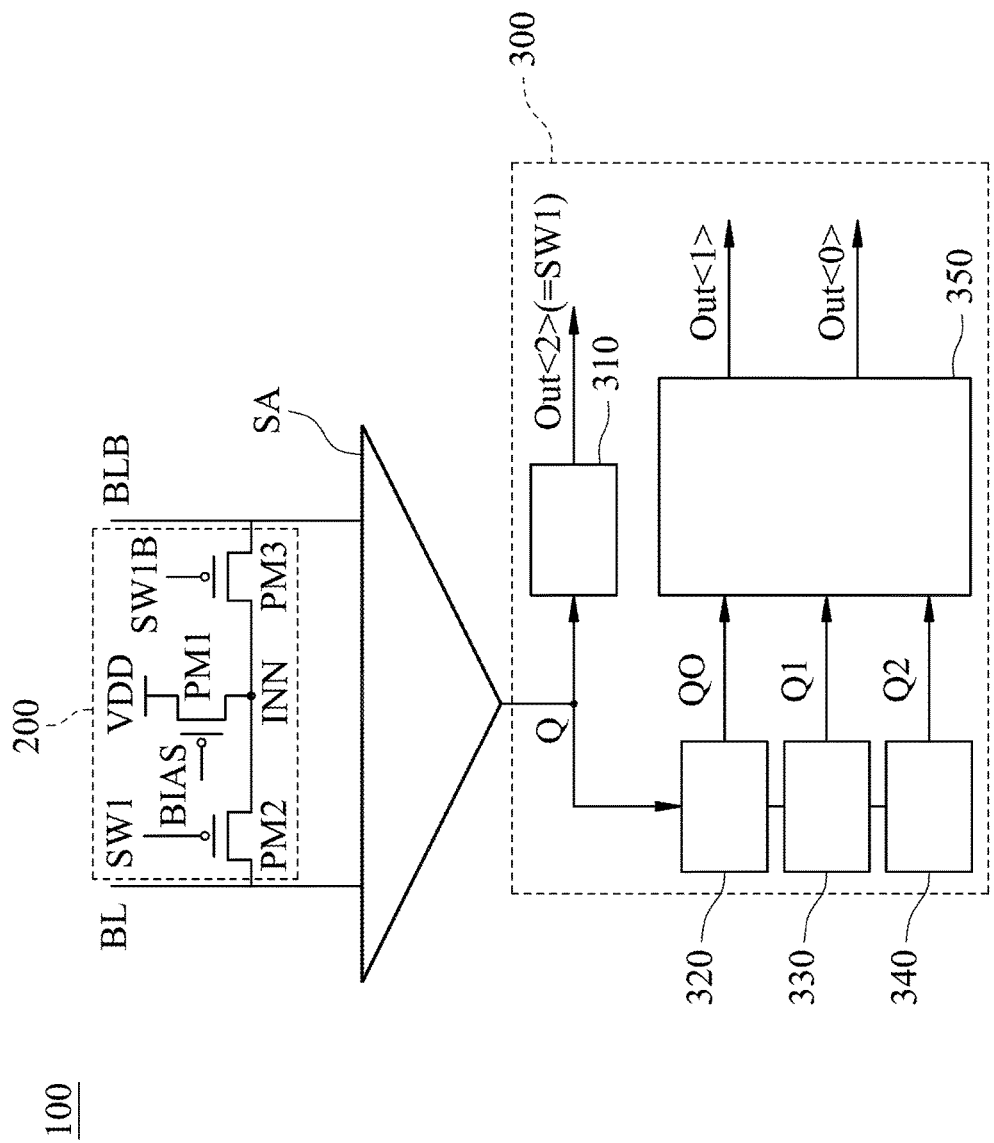
FIG. 3 shows a block diagram of a reference-free multi-level sensing circuit for computing-in-memory applications according to one embodiment of the present disclosure.
Figure 4:
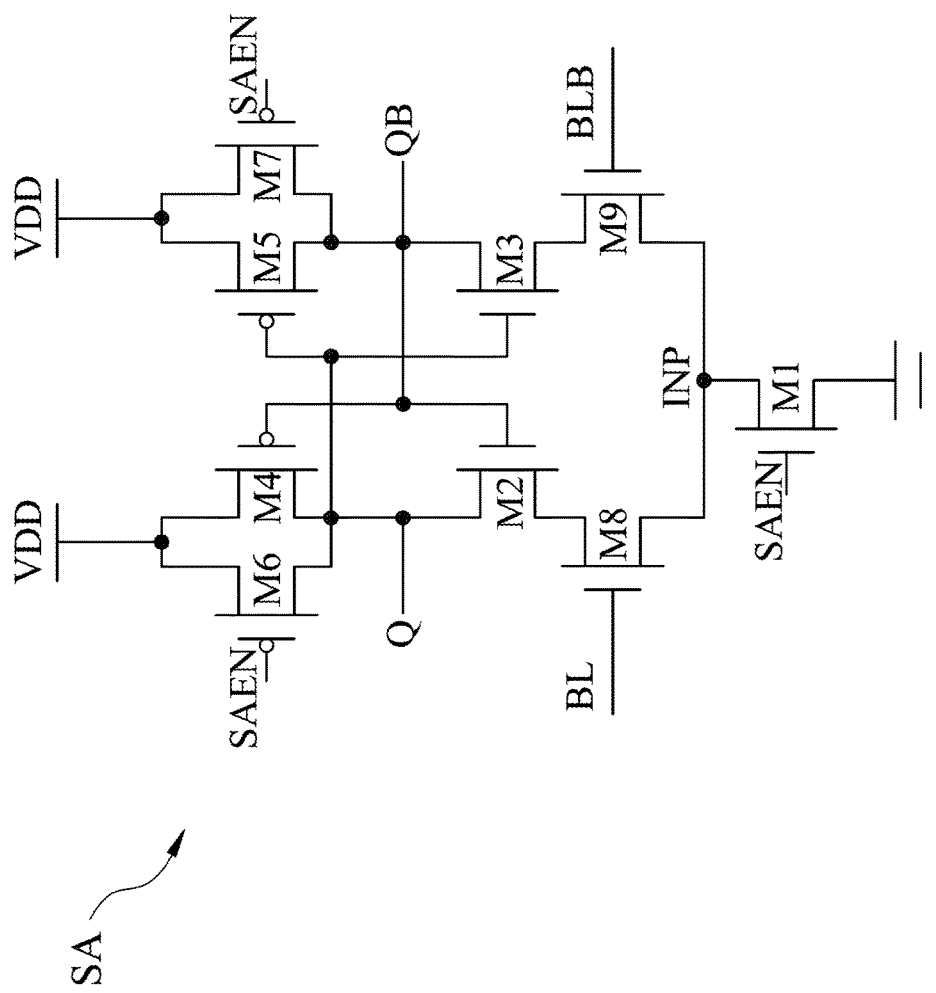
FIG. 4 shows a circuit diagram of a sense amplifier of the reference-free multi-level sensing circuit for the computing-in-memory applications of FIG. 3.

FIG. 3 shows a block diagram of a reference-free multi-level sensing circuit 100 for computing-in-memory applications according to one embodiment of the present disclosure; and FIG. 4 shows a circuit diagram of a sense amplifier SA of the reference-free multi-level sensing circuit 100 for the computing-in-memory applications of FIG. 3. The reference-free multi-level sensing circuit 100 for the computing-in-memory applications is controlled by a first bit line BL and a second bit line BLB. The reference-free multi-level sensing circuit 100 for the computing-in-memory applications includes a voltage sense amplifier SA, a precharging unit 200 and an encoding unit 300.

The voltage sense amplifier SA is electrically connected to the first bit line BL and the second bit line BLB. In detail, the voltage sense amplifier SA has an inner node INP, a first output node Q and a second output node QB, as shown in FIG. 4. The voltage sense amplifier SA includes a first transistor M1, a second transistor M2, a third transistor M3, a fourth transistor M4, a fifth transistor M5, a sixth transistor M6, a seventh transistor M7, an eighth transistor M8 and a ninth transistor M9. The first transistor M1 is connected between the inner node INP and a ground voltage. The second transistor M2 is connected to the first output node Q and the second output node QB. The third transistor M3 is connected to the first output node Q and the second output node QB. The fourth transistor M4 is connected between the second transistor M2 and the voltage source VDD. The fourth transistor M4 is connected to the first output node Q and the second output node QB. The fifth transistor M5 is connected between the third transistor M3 and the voltage source VDD. The fifth transistor M5 is connected to the first output node Q and the second output node QB. The sixth transistor M6 is connected between the second transistor M2 and the voltage source VDD. The sixth transistor M6 is connected to the first output node Q. The seventh transistor M7 is connected between the third transistor M3 and the voltage source VDD. The seventh transistor M7 is connected to the second output node QB. The eighth transistor M8 is connected between the second transistor M2 and the first transistor M1. The eighth transistor M8 is connected to the inner node INP and the first bit line BL. The ninth transistor M9 is connected between the third transistor M3 and the first transistor M1. The ninth transistor M9 is connected to the inner node INP and the second bit line BLB. Each of the first transistor M1, the second transistor M2, the third transistor M3, the eighth transistor M8 and the ninth transistor M9 is an NMOS transistor. Each of the fourth transistor M4, the fifth transistor M5, the sixth transistor M6 and the seventh transistor M7 is a PMOS transistor.

The precharging unit 200 is electrically connected between the first bit line BL and the second bit line BLB, so that the precharging unit 200 is electrically connected to the voltage sense amplifier SA via the first bit line BL and the second bit line BLB. The precharging unit 200 is controlled by a switching signal SW1, an inverse switching signal SW1B and a bias voltage BIAS. The switching signal SW1 and the inverse switching signal SW1B are inverted relative to each other. In detail, the precharging unit 200 has an internal node INN and includes a first precharging transistor PM1, a second precharging transistor PM2 and a third precharging transistor PM3. The first precharging transistor PM1 has a first precharging gate, a first precharging drain and a first precharging source. The first precharging gate is coupled to the bias voltage BIAS. The first precharging drain is connected to the internal node INN, and the first precharging source is coupled to the voltage source VDD. The second precharging transistor PM2 has a second precharging gate, a second precharging drain and a second precharging source. The second precharging gate is coupled to the switching signal SW1. The second precharging drain is connected to the first bit line BL, and the second precharging source is connected to the internal node INN. The third precharging transistor PM3 has a third precharging gate, a third precharging drain and a third precharging source. The third precharging gate is coupled to the inverse switching signal SW1B. The third precharging drain is connected to the second bit line BLB, and the third precharging source is connected to the internal node INN. Each of the first precharging transistor PM1, the second precharging transistor PM2 and the third precharging transistor PM3 is a PMOS transistor.

The encoding unit 300 is electrically connected to the voltage sense amplifier SA. The encoding unit 300 includes a first register 310, a second register 320, a third register 330, a fourth register 340 and an encoder 350. The first register 310 is electrically connected to the voltage sense amplifier SA and outputs a first register output value OUT<2>. The first register output value OUT<2> is equal to the switching signal SW1. In other words, the first register output value OUT<2> feedback controls the precharging unit 200 so as to enable the precharging unit 200 to precharge one of the first bit line BL and the second bit line BLB according to the first register output value OUT<2>. A voltage level of the one of the first bit line BL and the second bit line BLB is lower than a voltage level of the other one of the first bit line BL and the second bit line BLB. The second register 320 is electrically connected to the voltage sense amplifier SA and outputs a second register output value Q0. The third register 330 is electrically connected to the second register 320 and outputs a third register output value Q1. The fourth register 340 is electrically connected to the third register 330 and outputs a fourth register output value Q2. The encoder 350 is electrically connected to the second register 320, the third register 330 and the fourth register 340. The encoder 350 generates a plurality of encoded values according to the second register output value Q0, the third register output value Q1 and the fourth register output value Q2. The encoded values include a first encoded value OUT<0> and a second encoded value OUT<1>. The encoded values and the first register output value OUT<2> are formed a multi-bit signal OUT<2:0> to estimate voltage levels of the first bit line BL and the second bit line BLB. When the second register output value Q0, the third register output value Q1 and the fourth register output value Q2 are equal to 1, 1, 1, respectively, the first encoded value OUT<0> and the second encoded value OUT<1> are equal to 1, 1, respectively. When the second register output value Q0, the third register output value Q1 and the fourth register output value Q2 are equal to 0, 1, 1, respectively, the first encoded value OUT<0> and the second encoded value OUT<1> are equal to 0, 1, respectively. When the second register output value Q0, the third register output value Q1 and the fourth register output value Q2 are equal to 0, 0, 1, respectively, the first encoded value OUT<0> and the second encoded value OUT<1> are equal to 1, 0, respectively. When the second register output value Q0, the third register output value Q1 and the fourth register output value Q2 are equal to 0, 0, 0, respectively, the first encoded value OUT<0> and the second encoded value OUT<1> are equal to 0, 0, respectively. Therefore, the reference-free multi-level sensing circuit 100 for the computing-in-memory applications of the present disclosure utilizes a differential multi-level sensing scheme without any reference generator so as to increase a sensing margin and remove the power consumption of the reference generator.

Figure 5:
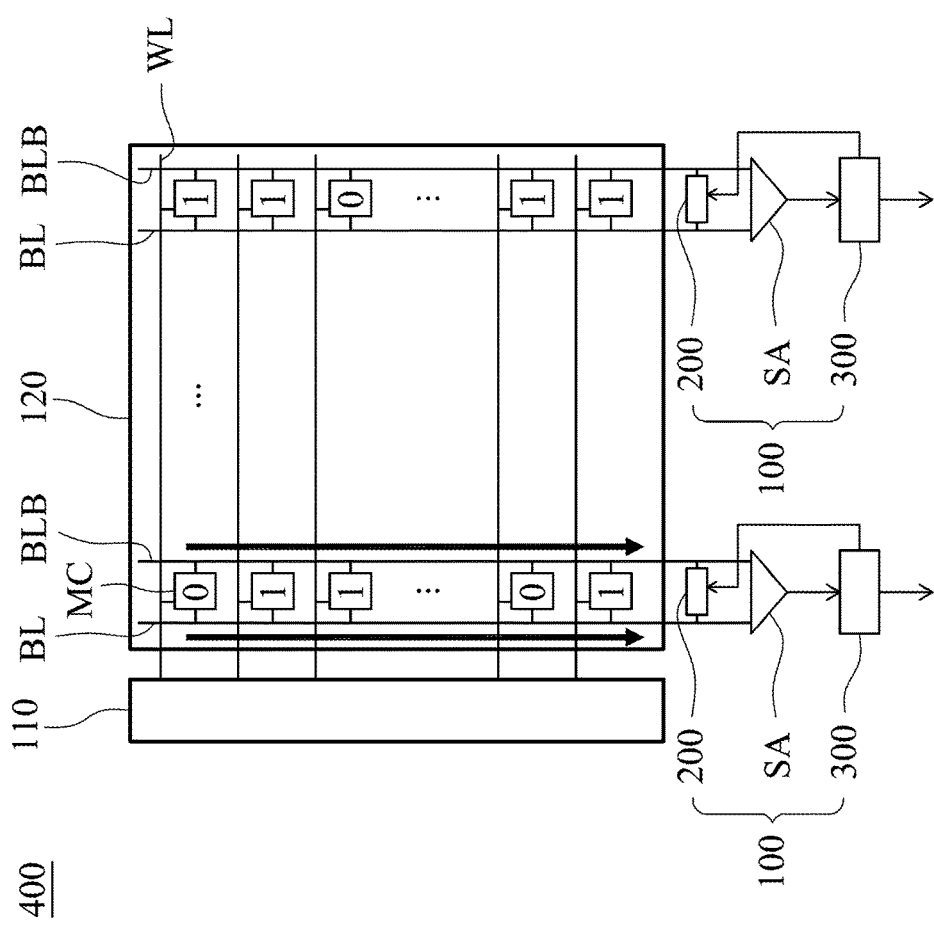
FIG. 5 shows a block diagram of a reference-free memory unit for computing-in-memory applications according to another embodiment of the present disclosure.
Figure 6:
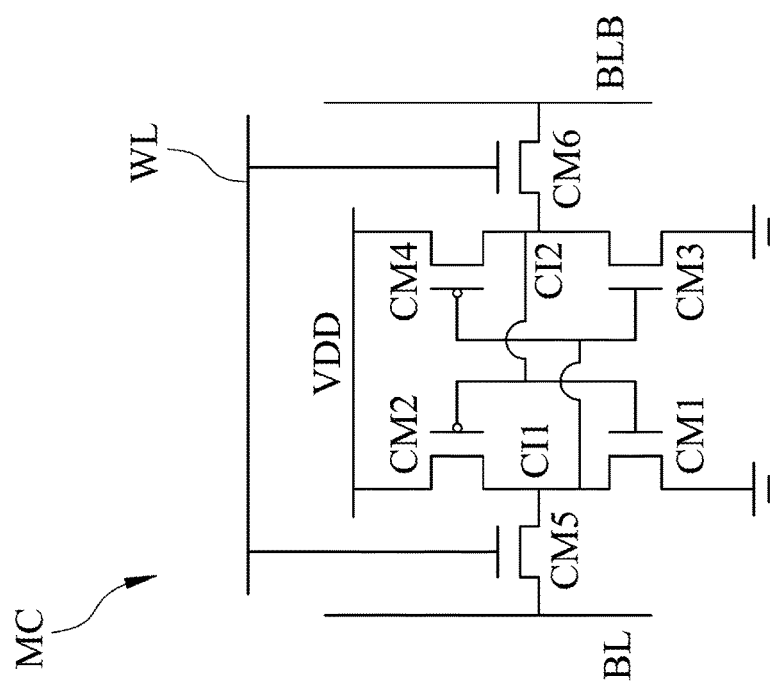
FIG. 6 shows a circuit diagram of a memory cell of the memory unit of FIG. 5.

FIG. 5 shows a block diagram of a reference-free memory unit 400 for computing-in-memory applications according to another embodiment of the present disclosure; and FIG. 6 shows a circuit diagram of a memory cell MC of the memory unit of FIG. 5. The reference-free memory unit 400 for the computing-in-memory applications includes a word-line driver 110, a memory array 120 and a plurality of reference-free multi-level sensing circuits 100 for the computing-in-memory applications.

The word-line driver 110 generates a plurality of word lines WL. The memory array 120 is electrically connected to the word-line driver 110 via the word lines WL. The memory array 120 includes a plurality of memory cells MC. Each of the memory cells MC is connected between a first bit line BL and a second bit line BLB. Each of the memory cells MC is connected to one of the word lines WL and controlled by the one of the word lines WL. Each of the reference-free multi-level sensing circuits 100 for the computing-in-memory applications is connected to the memory array 120 via the first bit line BL and the second bit line BLB. In one embodiment, each of the memory cells MC has a first cell internal node CI1 and a second cell internal node CI2. Each of the memory cells includes a first memory cell transistor CM1, a second memory cell transistor CM2, a third memory cell transistor CM3, a fourth memory cell transistor CM4, a fifth memory cell transistor CM5 and a sixth memory cell transistor CM6, as shown in FIG. 6. The first memory cell transistor CM1 is connected to the ground voltage, the first cell internal node CI1 and the second cell internal node CI2. The second memory cell transistor CM2 is connected to the voltage source VDD, the first cell internal node CI1 and the second cell internal node CI2. The third memory cell transistor CM3 is connected to the ground voltage, the first cell internal node CI1 and the second cell internal node CI2. The fourth memory cell transistor CM4 is connected to the voltage source VDD, the first cell internal node CI1 and the second cell internal node CI2. The fifth memory cell transistor CM5 is connected to the first cell internal node CI1, the first bit line BL and the word line WL. The sixth memory cell transistor CM6 is connected to the second cell internal node CI2 the second bit line BLB and the word line WL. Each of the first memory cell transistor CM1, the third memory cell transistor CM3, the fifth memory cell transistor CM5 and the sixth memory cell transistor CM6 is an NMOS transistor. Each of the second memory cell transistor CM2 and the fourth memory cell transistor CM4 is a PMOS transistor. Accordingly, the reference-free memory unit 400 for the computing-in-memory applications of the present disclosure utilizes a differential multi-level sensing scheme without any reference generator so as to increase a sensing margin and remove the power consumption of the reference generator.

Figure 1:
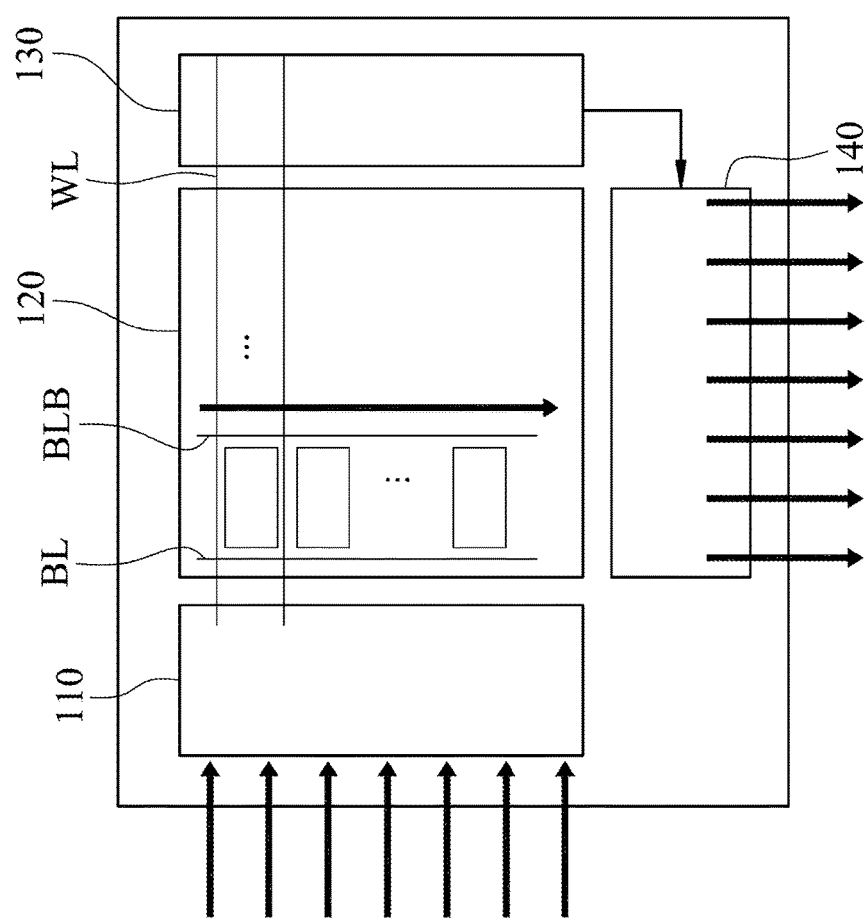
FIG. 1 shows a block diagram of a conventional memory unit for computing-in-memory applications.
Figure 2:
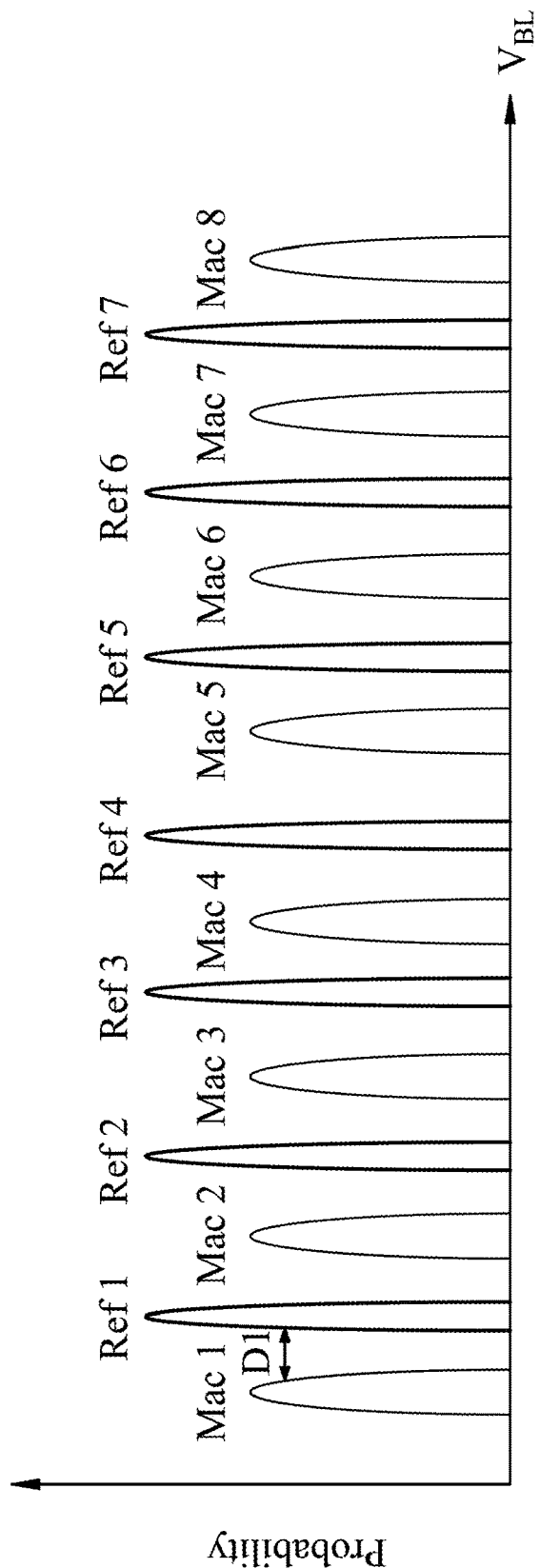
FIG. 2 shows a schematic view of a probability distribution of a voltage of a first bit line of FIG. 1.
Figure 7:
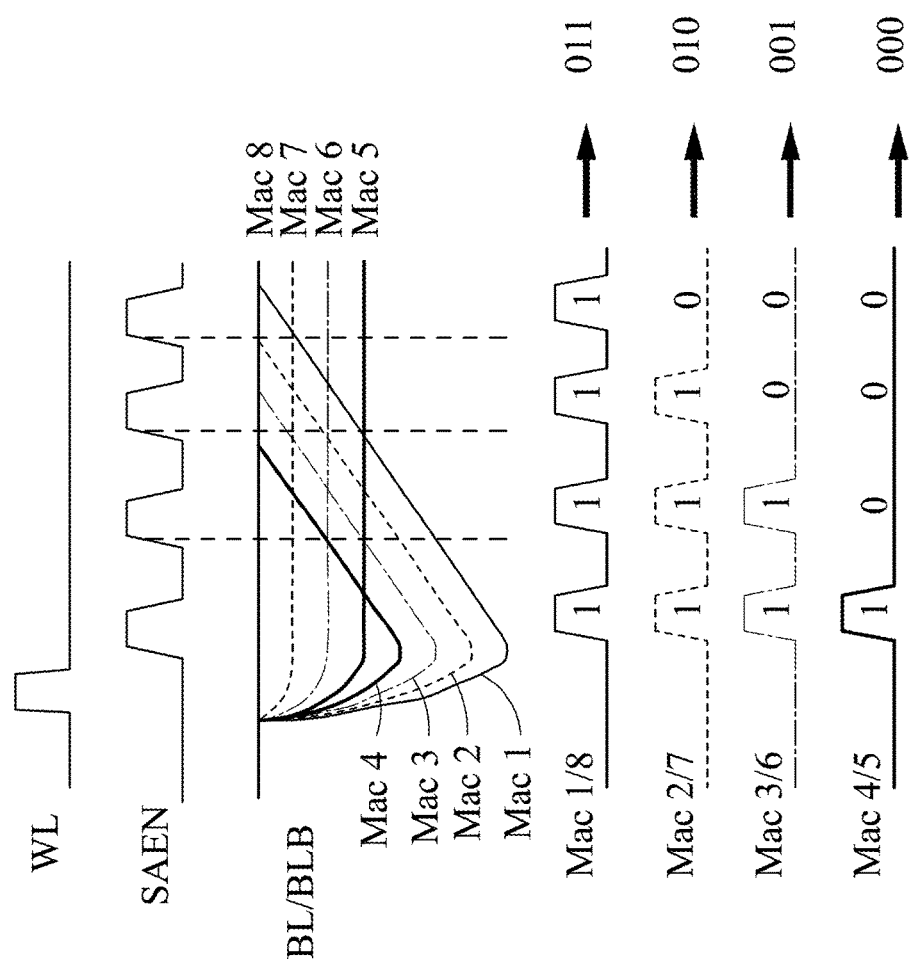
FIG. 7 shows timing diagrams of voltages of the first bit line, the second bit line and the voltage sense amplifier of FIG. 3.
Figure 8:
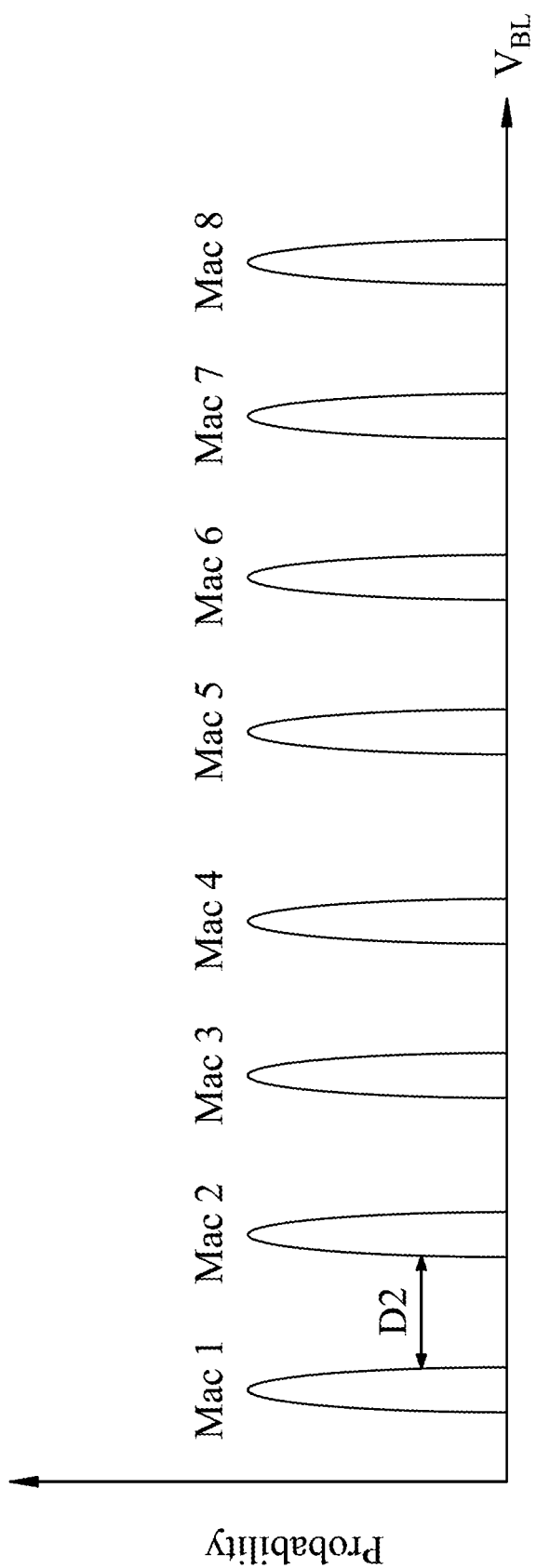
FIG. 8 shows a schematic view of a probability distribution of a voltage of the first bit line of FIG. 3.

FIG. 7 shows timing diagrams of voltages of the first bit line BL, the second bit line BLB and the voltage sense amplifier SA of FIG. 3; and FIG. 8 shows a schematic view of a probability distribution of a voltage $V_{BL}$ of a first bit line BL of FIG. 3. There are four examples in FIG. 7. In a first example, "Mac 1" represents a voltage level of one of the first bit line BL and the second bit line BLB. "Mac 8" represents a voltage level of the other one of the first bit line BL and the second bit line BLB. "Mac 1" is lower than "Mac 8" during four SAEN clock cycles and precharged by the precharging unit 200. "Mac 1/8" represents a comparison result between "Mac 1" and "Mac 8". In a second example, "Mac 2" represents the voltage level of one of the first bit line BL and the second bit line BLB. "Mac 7" represents the voltage level of the other one of the first bit line BL and the second bit line BLB. "Mac 2" is lower than "Mac 7" during three SAEN clock cycles and precharged by the precharging unit 200. "Mac 2/7" represents a comparison result between "Mac 2" and "Mac 7". In a third example, "Mac 3" represents the voltage level of one of the first bit line BL and the second bit line BLB. "Mac 6" represents the voltage level of the other one of the first bit line BL and the second bit line BLB. "Mac 3" is lower than "Mac 6" during two SAEN clock cycles and precharged by the precharging unit 200. "Mac 3/6" represents a comparison result between "Mac 3" and "Mac 6". In a fourth example, "Mac 4" represents the voltage level of one of the first bit line BL and the second bit line BLB. "Mac 5" represents the voltage level of the other one of the first bit line BL and the second bit line BLB. "Mac 4" is lower than "Mac 5" during one SAEN clock cycle and precharged by the precharging unit 200. "Mac 4/5" represents a comparison result between "Mac 4" and "Mac 5". In FIGS. 2 and 8, it is obvious that a sensing margin D2 of the present disclosure is about twice greater than a sensing margin D1 of the conventional memory unit due to the lack of the reference generator.

Figure 9:
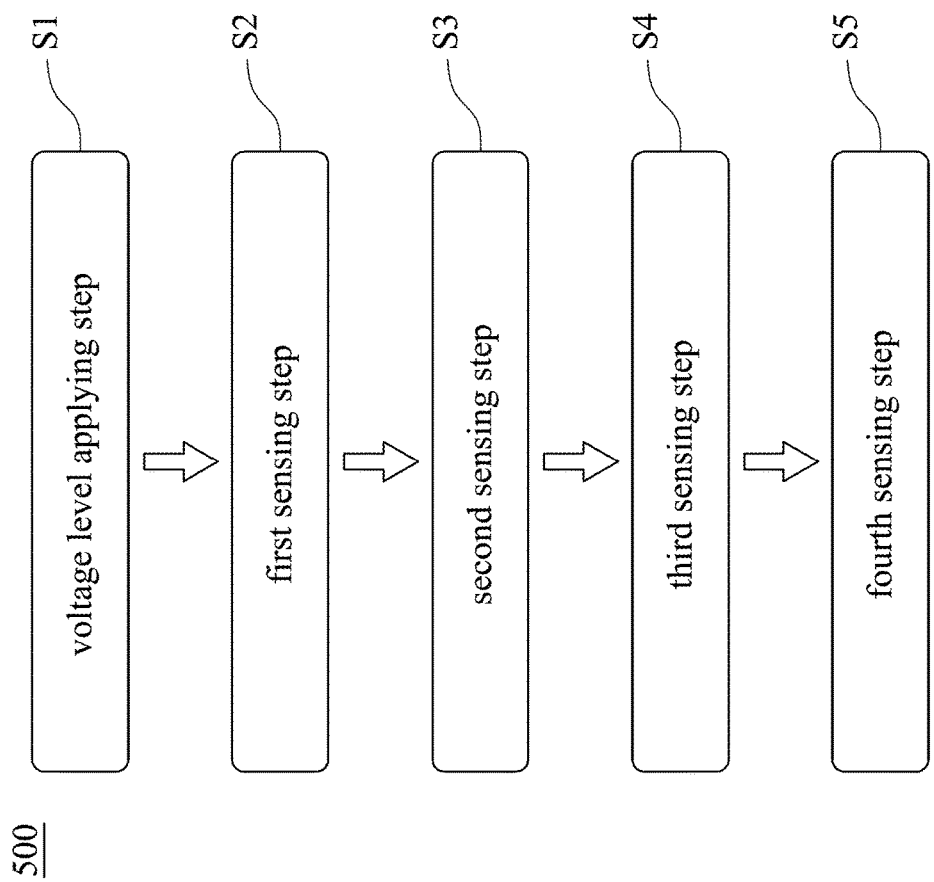
FIG. 9 shows a flow chart of a sensing method of a reference-free memory unit for computing-in-memory applications according to further another embodiment of the present disclosure.

FIG. 9 shows a flow chart of a sensing method 500 of a reference-free memory unit 400 for computing-in-memory applications according to further another embodiment of the present disclosure. The sensing method 500 provides a voltage level applying step S1, a first sensing step S2, a second sensing step S3, a third sensing step S4 and a fourth sensing step S5.

The voltage level applying step S1 is for applying a voltage level to the word line WL. The first sensing step S2 is for driving the memory cell MC to generate the voltage levels of the first bit line BL and the second bit line BLB according to the voltage level of the word line WL. The second sensing step S3 is for driving the voltage sense amplifier SA to generate an output voltage level of a first output node Q according to the first bit line BL and the second bit line BLB. The third sensing step S4 is for driving the encoding unit 300 to generate a switching signal SW1 (i.e., the first register output value OUT<2>) according to the output voltage level of the first output node Q, and transmitting the switching signal SW1 to the precharging unit 200 so as to enable the precharging unit 200 to precharge one of the first bit line BL and the second bit line BLB according to the first register output value OUT<2>. The voltage level of the one of the first bit line BL and the second bit line BLB is lower than a voltage level of the other one of the first bit line BL and the second bit line BLB. The fourth sensing step S5 is for driving the voltage sense amplifier SA and the encoding unit 300 to generate the multi-bit signal OUT<2:0> according to the first bit line BL and the second bit line BLB.

In addition, in the third sensing step S4, the precharging unit 200 is coupled between the first bit line BL and the second bit line BLB. The precharging unit 200 is electrically connected to the memory cell MC via the first bit line BL and the second bit line BLB. The precharging unit 200 is controlled by a switching signal SW1, an inverse switching signal SW1B and a bias voltage BIAS, and the first register output value OUT<2> is equal to the switching signal SW1. The precharging unit 200 includes a first precharging transistor PM1, a second precharging transistor PM2 and a third precharging transistor PM3. The first precharging transistor PM1, the second precharging transistor PM2 and the third precharging transistor PM3 are controlled by the bias voltage BIAS, the switching signal SW1 and the inverse switching signal SW1B, respectively. In the fourth sensing step S5, the encoded values include a first encoded value OUT<0> and a second encoded value OUT<1>. When the second register output value Q0, the third register output value Q1 and the fourth register output value Q2 are equal to 1, 1, 1, respectively, the first encoded value OUT<0> and the second encoded value OUT<1> are equal to 1, 1, respectively. When the second register output value Q0, the third register output value Q1 and the fourth register output value Q2 are equal to 0, 1, 1, respectively, the first encoded value OUT<0> and the second encoded value OUT<1> are equal to 0, 1, respectively. When the second register output value Q0, the third register output value Q1 and the fourth register output value Q2 are equal to 0, 0, 1, respectively, the first encoded value OUT<0> and the second encoded value OUT<1> are equal to 1, 0, respectively. When the second register output value Q0, the third register output value Q1 and the fourth register output value Q2 are equal to 0, 0, 0, respectively, the first encoded value OUT<0> and the second encoded value OUT<1> are equal to 0, 0, respectively. Therefore, the sensing method 500 of the present disclosure utilizes a differential multi-level sensing scheme without any reference generator to sense the first bit line BL and the second bit line BLB to obtain the switching signal SW1, and then precharge the lower potential one of the first bit line BL and the second bit line BLB via the switching signal SW1. Moreover, the sensing method 500 of the present disclosure utilizes a single-ended precharging scheme which does not consume additional power because the first bit line BL and the second bit line BLB still need to be precharged in the next cycle, so that the sensing method 500 of the present disclosure is suitable for the computing-in-memory applications.

According to the aforementioned embodiments and examples, the advantages of the present disclosure are described as follows.

1. The reference-free multi-level sensing circuit for the computing-in-memory applications, the reference-free memory unit for the computing-in-memory applications and the sensing method thereof utilize a differential multi-level sensing scheme without any reference generator so as to increase sensing margin to achieve high accuracy and remove the power consumption of the reference generator.

2. The sensing method of the present disclosure utilizes a differential multi-level sensing scheme without any reference generator to sense the first bit line and the second bit line to obtain the switching signal, and then precharge the lower potential one of the first bit line and the second bit line via the switching signal. Moreover, the sensing method of the present disclosure utilizes a single-ended precharging scheme which does not consume additional power because the first bit line and the second bit line still need to be precharged in the next cycle, so that the sensing method of the present disclosure is suitable for the computing-in-memory applications.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A reference-free multi-level sensing circuit for computing-in-memory applications, which is controlled by a first bit line and a second bit line, the reference-free multi-level sensing circuit for the computing-in-memory applications comprising:

a voltage sense amplifier electrically connected to the first bit line and the second bit line;
a precharging unit electrically connected between the first bit line and the second bit line; and
an encoding unit electrically connected to the voltage sense amplifier, and comprising:
  a first register electrically connected to the voltage sense amplifier and outputting a first register output value, wherein the first register output value feedback controls the precharging unit so as to enable the precharging unit to precharge one of the first bit line and the second bit line according to the first register output value, and a voltage level of the one of the first bit line and the second bit line is lower than a voltage level of the other one of the first bit line and the second bit line;
  a second register electrically connected to the voltage sense amplifier and outputting a second register output value;
  a third register electrically connected to the second register and outputting a third register output value;
  a fourth register electrically connected to the third register and outputting a fourth register output value; and
  an encoder electrically connected to the second register, the third register and the fourth register, wherein the encoder generates a plurality of encoded values according to the second register output value, the third register output value and the fourth register output value, and the encoded values and the first register output value are formed a multi-bit signal to estimate voltage levels of the first bit line and the second bit line.

2. The reference-free multi-level sensing circuit for the computing-in-memory applications of claim 1, wherein the precharging unit is coupled between the first bit line and the second bit line, the precharging unit is controlled by a switching signal, an inverse switching signal and a bias voltage, and the first register output value is equal to the switching signal.

3. The reference-free multi-level sensing circuit for the computing-in-memory applications of claim 2, wherein the precharging unit has an internal node and comprises:
  a first precharging transistor having a first precharging gate, a first precharging drain and a first precharging source, wherein the first precharging gate is coupled to the bias voltage, the first precharging drain is connected to the internal node, and the first precharging source is coupled to a voltage source;
  a second precharging transistor having a second precharging gate, a second precharging drain and a second precharging source, wherein the second precharging gate is coupled to the switching signal, the second precharging drain is connected to the first bit line, and the second precharging source is connected to the internal node; and
  a third precharging transistor having a third precharging gate, a third precharging drain and a third precharging source, wherein the third precharging gate is coupled to the inverse switching signal, the third precharging drain is connected to the second bit line, and the third precharging source is connected to the internal node.

4. The reference-free multi-level sensing circuit for the computing-in-memory applications of claim 1, wherein the voltage sense amplifier has an inner node, a first output node and a second output node, and the voltage sense amplifier comprises:

a first transistor connected between the inner node and a ground voltage;
a second transistor connected to the first output node and the second output node;
a third transistor connected to the first output node and the second output node;
a fourth transistor connected between the second transistor and a voltage source, wherein the fourth transistor is connected to the first output node and the second output node;
a fifth transistor connected between the third transistor and the voltage source, wherein the fifth transistor is connected to the first output node and the second output node;
a sixth transistor connected between the second transistor and the voltage source, wherein the sixth transistor is connected to the first output node;
a seventh transistor connected between the third transistor and the voltage source, wherein the seventh transistor is connected to the second output node;
an eighth transistor connected between the second transistor and the first transistor, wherein the eighth transistor is connected to the inner node and the first bit line; and
a ninth transistor connected between the third transistor and the first transistor, wherein the ninth transistor is connected to the inner node and the second bit line.

5. The reference-free mufti-level sensing circuit for the computing-in-memory applications of claim 1, wherein the encoded values comprise a first encoded value and a second encoded value;
  wherein when the second register output value, the third register output value and the fourth register output value are equal to 1, 1, 1, respectively, the first encoded value and the second encoded value are equal to 1, 1, respectively;
  wherein when the second register output value, the third register output value and the fourth register output value are equal to 0, 1, 1, respectively, the first encoded value and the second encoded value are equal to 0, 1, respectively;
  wherein when the second register output value, the third register output value and the fourth register output value are equal to 0, 0, 1, respectively, the first encoded value and the second encoded value are equal to 1, 0, respectively;
  wherein when the second register output value, the third register output value and the fourth register output value are equal to 0, 0, 0, respectively, the first encoded value and the second encoded value are equal to 0, 0, respectively.

6. A reference-free memory unit for computing-in-memory applications, comprising:
  at least one memory cell connected between a first bit line and a second bit line, wherein the at least one memory cell is connected to a word line and controlled by the word line; and
  a reference-free multi-level sensing circuit for computing-in-memory applications connected to the at least one memory cell and controlled by the first bit line, the second bit line and the word line, and comprising:
    a voltage sense amplifier electrically connected to the first bit line and the second bit line;
    a precharging unit electrically connected between the first bit line and the second bit line; and
    an encoding unit electrically connected to the voltage sense amplifier and comprising:

a first register electrically connected to the voltage sense amplifier and outputting a first register output value, wherein the first register output value feedback controls the precharging unit so as to enable the precharging unit to precharge one of the first bit line and the second bit line according to the first register output value, and a voltage level of the one of the first bit line and the second bit line is lower than a voltage level of the other one of the first bit line and the second bit line;

a second register electrically connected to the voltage sense amplifier and outputting a second register output value;

a third register electrically connected to the second register and outputting a third register output value;

a fourth register electrically connected to the third register and outputting a fourth register output value; and an encoder electrically connected to the second register, the third register and the fourth register, wherein the encoder generates a plurality of encoded values according to the second register output value, the third register output value and the fourth register output value, and the encoded values and the first register output value are formed a multi-bit signal to estimate voltage levels of the first bit line and the second bit line.

7. The reference-free memory unit for the computing-in-memory applications of claim 6, wherein the at least one memory cell has a first cell internal node and a second cell internal node, and the at least one memory cell comprises:

a first memory cell transistor connected to a ground voltage, the first cell internal node and the second cell internal node;

a second memory cell transistor connected to a voltage source, the first cell internal node and the second cell internal node;

a third memory cell transistor connected to the ground voltage, the first cell internal node and the second cell internal node;

a fourth memory cell transistor connected to the voltage source, the first cell internal node and the second cell internal node;

a fifth memory cell transistor connected to the first cell internal node, the first bit line and the word line; and a sixth memory cell transistor connected to the second cell internal node, the second bit line and the word line;

wherein each of the first memory cell transistor, the third memory cell transistor, the fifth memory cell transistor and the sixth memory cell transistor is an NMOS transistor, and each of the second memory cell transistor and the fourth memory cell transistor is a PMOS transistor.

8. The reference-free memory unit for the computing-in-memory applications of claim 6, wherein the precharging unit is coupled between the first bit line and the second bit line, the precharging unit is electrically connected to the memory cell via the first bit line and the second bit line, the precharging unit is controlled by a switching signal, an inverse switching signal and a bias voltage, and the first register output value is equal to the switching signal.

9. The reference-free memory unit for the computing-in-memory applications of claim 8, wherein the precharging unit has an internal node and comprises:

a first precharging transistor having a first precharging gate, a first precharging drain and a first precharging source, wherein the first precharging gate is coupled to the bias voltage, the first precharging drain is connected to the internal node, and the first precharging source is coupled to a voltage source;

a second precharging transistor having a second precharging gate, a second precharging drain and a second precharging source, wherein the second precharging gate is coupled to the switching signal, the second precharging drain is connected to the first bit line, and the second precharging source is connected to the internal node; and a third precharging transistor having a third precharging gate, a third precharging drain and a third precharging source, wherein the third precharging gate is coupled to the inverse switching signal, the third precharging drain is connected to the second bit line, and the third precharging source is connected to the internal node.

10. The reference-free memory unit for the computing-in-memory applications of claim 6, wherein the voltage sense amplifier has an inner node, a first output node and a second output node, and the voltage sense amplifier comprises:

a first transistor connected between the inner node and a ground voltage;

a second transistor connected to the first output node and the second output node;

a third transistor connected to the first output node and the second output node;

a fourth transistor connected between the second transistor and a voltage source, wherein the fourth transistor is connected to the first output node and the second output node;

a fifth transistor connected between the third transistor and the voltage source, wherein the fifth transistor is connected to the first output node and the second output node;

a sixth transistor connected between the second transistor and the voltage source, wherein the sixth transistor is connected to the first output node;

a seventh transistor connected between the third transistor and the voltage source, wherein the seventh transistor is connected to the second output node;

an eighth transistor connected between the second transistor and the first transistor, wherein the eighth transistor is connected to the inner node and the first bit line; and a ninth transistor connected between the third transistor and the first transistor, wherein the ninth transistor is connected to the inner node and the second bit line.

11. The reference-free memory unit for the computing-in-memory applications of claim 6, wherein the encoded values comprise a first encoded value and a second encoded value;

wherein when the second register output value, the third register output value and the fourth register output value are equal to 1, 1, 1, respectively, the first encoded value and the second encoded value are equal to 1, 1, respectively;

wherein when the second register output value, the third register output value and the fourth register output value are equal to 0, 1, 1, respectively, the first encoded value and the second encoded value are equal to 0, 1, respectively;

wherein when the second register output value, the third register output value and the fourth register output value are equal to 0, 0, 1, respectively, the first encoded value and the second encoded value are equal to 1, 0, respectively;

wherein when the second register output value, the third register output value and the fourth register output value are equal to 0, 0, 0, respectively, the first encoded value and the second encoded value are equal to 0, 0, respectively.

12. A sensing method of the reference-free memory unit for the computing-in-memory applications of claim 6, comprising:

providing a voltage level applying step, wherein the voltage level applying step is for applying a voltage level to the word line;

providing a first sensing step, wherein the first sensing step is for driving the memory cell to generate the voltage levels of the first bit line and the second bit line according to the voltage level of the word line;

providing a second sensing step, wherein the second sensing step is for driving the voltage sense amplifier to generate an output voltage level of a first output node according to the first bit line and the second bit line;

providing a third sensing step, wherein the third sensing step is for driving the encoding unit to generate a switching signal according to the output voltage level of the first output node, and transmitting the switching signal to the precharging unit so as to enable the precharging unit to precharge one of the first bit line and the second bit line according to the first register output value, and the voltage level of the one of the first bit line and the second bit line is lower than a voltage level of the other one of the first bit line and the second bit line; and providing a fourth sensing step, wherein the fourth sensing step is for driving the voltage sense amplifier and the encoding unit to generate the multi-bit signal according to the first bit line and the second bit line.

13. The sensing method of claim 12, wherein, in the third sensing step, the precharging unit is coupled between the first bit line and the second bit line, the precharging unit is electrically connected to the memory cell via the first bit line and the second bit line, the precharging unit is controlled by a switching signal, an inverse switching signal and a bias voltage, and the first register output value is equal to the switching signal.

14. The sensing method of claim 13, wherein, in the third sensing step, the precharging unit comprises a first precharging transistor, a second precharging transistor and a third precharging transistor, and the first precharging transistor, the second precharging transistor and the third precharging transistor are controlled by the bias voltage, the switching signal and the inverse switching signal.

15. The sensing method of claim 12, wherein, in the fourth sensing step, the encoded values comprise a first encoded value and a second encoded value;

wherein when the second register output value, the third register output value and the fourth register output value are equal to 1, 1, 1, respectively, the first encoded value and the second encoded value are equal to 1, 1, respectively;

wherein when the second register output value, the third register output value and the fourth register output value are equal to 0, 1, 1, respectively, the first encoded value and the second encoded value are equal to 0, 1, respectively;

wherein when the second register output value, the third register output value and the fourth register output value are equal to 0, 0, 1, respectively, the first encoded value and the second encoded value are equal to 1, 0, respectively;

wherein when the second register output value, the third register output value and the fourth register output value are equal to 0, 0, 0, respectively, the first encoded value and the second encoded value are equal to 0, 0, respectively.

* * * * *